United States Patent [19]

Imai et al.

[11] Patent Number: 4,758,127
[45] Date of Patent: Jul. 19, 1988

[54] ORIGINAL FEEDING APPARATUS AND A CASSETTE FOR CONTAINING THE ORIGINAL

[75] Inventors: Shunzo Imai, Yamato; Hiroshi Sato, Tokyo; Kazuo Iizuka, Kawasaki, all of Japan

[73] Assignee: Canon Kabushiki Kaisha, Tokyo, Japan

[21] Appl. No.: 892,734

[22] Filed: Jul. 28, 1986

Related U.S. Application Data

[63] Continuation of Ser. No. 620,824, Jun. 15, 1984, abandoned.

[30] Foreign Application Priority Data

Jun. 24, 1983 [JP] Japan ............... 58-112928
Jun. 24, 1983 [JP] Japan ............... 58-112929

[51] Int. Cl.⁴ ............... B65D 85/30; G03B 9/02; G03B 41/16
[52] U.S. Cl. ............... 414/411; 206/328; 414/416; 414/786
[58] Field of Search ............... 414/277, 411, 416, 786; 354/276; 312/330 R, 12; 206/454–456, 316, 387, 328; 220/347

[56] References Cited

U.S. PATENT DOCUMENTS

| | | | |
|---|---|---|---|
| 3,044,198 | 7/1962 | Badalich | 206/454 X |
| 3,112,032 | 11/1963 | Riecke | 206/456 |
| 3,615,006 | 10/1971 | Freed | 206/454 |
| 4,049,142 | 9/1977 | Azzaroni | 414/411 X |
| 4,126,224 | 11/1978 | Laauwe et al. | 220/347 X |
| 4,363,403 | 12/1982 | Raucci, Jr. et al. | 206/387 |
| 4,428,480 | 1/1984 | Ackeret | 206/387 |
| 4,480,423 | 11/1984 | Muller | 414/411 X |
| 4,549,843 | 10/1985 | Jagusch et al. | 414/416 |

FOREIGN PATENT DOCUMENTS

| | | | |
|---|---|---|---|
| 56525 | 5/1977 | Japan | 354/276 |
| 70828 | 6/1977 | Japan | 354/276 |
| 40952 | 3/1982 | Japan | 414/416 |
| 64928 | 4/1982 | Japan | 414/411 |
| 183032 | 11/1982 | Japan | 354/276 |

OTHER PUBLICATIONS

Semiconductor Production, "New Automatic Wafer Handling Equipment", Autumn, 1980, pp. 31, 33.

*Primary Examiner*—Frank E. Werner
*Assistant Examiner*—David A. Bucci
*Attorney, Agent, or Firm*—Fitzpatrick, Cella Harper & Scinto

[57] ABSTRACT

An apparatus includes a plurality of cassettes each for containing a mask or reticle having thereon an integrated circuit pattern, each cassette having a holder for holding the mask or reticle while covering the lower surface thereof, the apparatus further including a carrier for storing therein the cassettes in a layered fashion, a fork for selectively taking out one of the holders from the carrier and an elevator for feeding the take-out holder to a separation station so that the mask or reticle is automatically taken out from, fed from and moved back into the carrier.

9 Claims, 4 Drawing Sheets

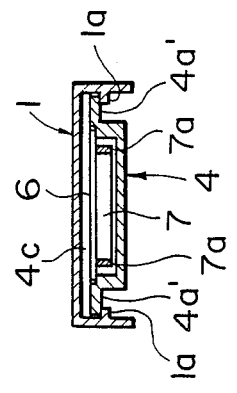
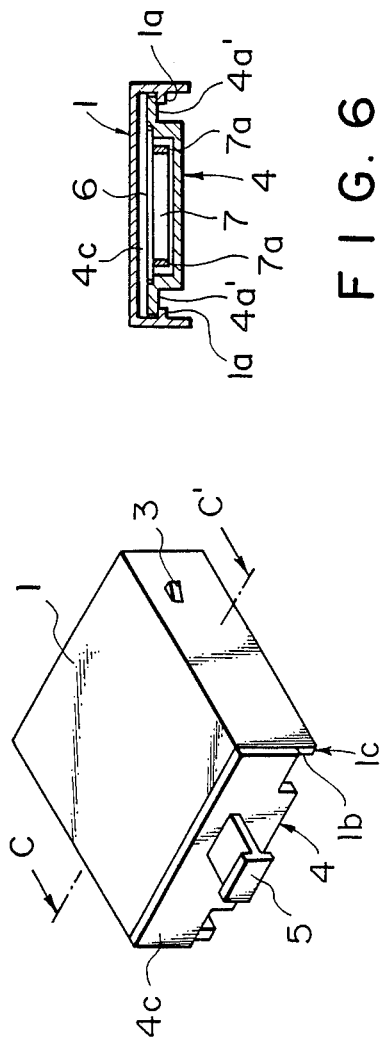
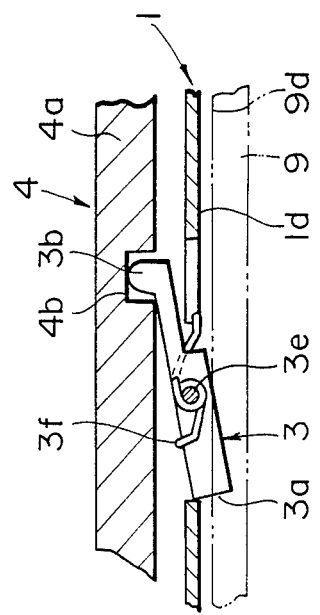

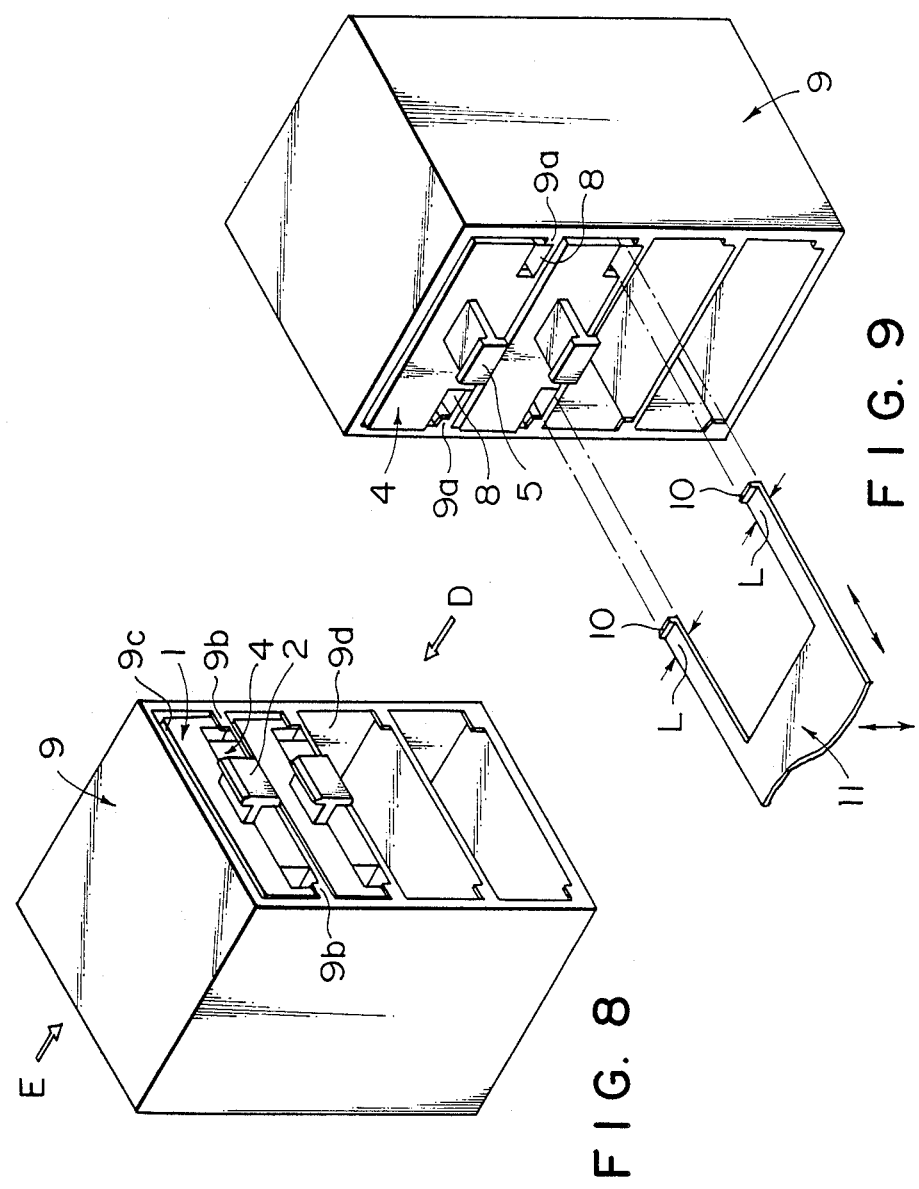

ORIGINAL FEEDING APPARATUS AND A CASSETTE FOR CONTAINING THE ORIGINAL

This application is a continuation of application Ser. No. 620,824, filed June 15, 1984, now abandoned.

BACKGROUND OF THE INVENTION

This invention relates to an apparatus for taking out and conveying, in a dust-proof state, an original such as a photomask or a reticle (which will be referred to simply as "mask") used in a semiconductor printing apparatus, and to a cassette for containing therein an original in a dust-proof state.

Manufacture of semiconductor elements such as integrated circuits (IC), large scaled integrated circuits (LSI), super large scaled integrated circuits (SLSI) and the like involves various problems to be solved. One of them is deposition of dust or foreign materials on the mask.

When a very fine pattern of such semiconductor integrated circuit is to be printed on the wafer and where any foreign material is deposited on the mask, the transferred semiconductor circuit pattern will be damaged. This leads not only to deterioration of the semiconductor, but also, in the worst case, to uselessness of the semiconductor.

The above problem is quite serious particularly in a projection exposure apparatus of step-and-repeat type (repeated exposure type), since in such exposure apparatus the semiconductor integrated circuit pattern of one mask is repeatedly printed on one wafer so that any foreign material deposited on the mask will damage all the chips of that wafer. Considering such problem of deposition of foreign materials, it is desired that the mask is kept as much as possible away from human beings which are a source of foreign materials.

In conventional exposure apparatuses, however, the mask has to be located at the exposure station by the manual labor of the operator so that it is difficult to prevent deposition, on the mask, of the foreign materials from the body of the operator.

Because of such limitation to the prevention of dust deposition in the conventional mask handling manner, development of a feeding system which ensures automatic mask feeding without relying on the manual labor of the operator is strongly desired, particularly in a projection exposure apparatus of the stop-and-repeat type.

SUMMARY OF THE INVENTION

It is accordingly a primary object of the present invention to provide an arrangement for keeping an original in a dust-proof state and for conveying the original to a transfer apparatus without relying on manual labor.

Another object of the present invention is to provide an arrangement for selectively feeding one of plural originals to a transfer apparatus and for moving back the used original to its initial position.

Still another object of the present invention is to provide an arrangement for ensuring that, when an original is taken out from a containing device, a taking device does not contact the surface of the original to damage it.

A further object of the present invention is to provide an arrangement for covering at least one surface of the original upon vertical movement during the feeding thereof to prevent deposition of foreign materials.

A still further object of the present invention is to provide an arrangement for containing plural originals within separate cassettes and for maintaining each cassette closed unless the original contained therein is to be used, to thereby prevent deposition of foreign materials.

In accordance with the present invention, the original is contained in a cassette to thereby facilitate the feeding or handling of the original and also to improve the dust-proof effect. Also in accordance with the present invention, the cassette is shaped so as to permit automatic attachment and detachment of the original.

Any deposition of foreign materials from the body of the operator on the mask can be prevented by the present invention, according to which the cassette as above is mounted on an exposure apparatus and the mask contained in the cassette is automatically fed from the cassette to the exposure station.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 5 is a perspective view showing the cassette.

FIG. 6 is a cross-sectional view of the cassette taken on line C-C' in FIG. 5.

FIG. 7 is a fragmentary cross-sectional view showing a pawl.

FIG. 8 is a perspective view showing plural cassettes inserted into a carrier.

FIG. 9 is a perspective view of the carrier in the direction of arrow E in FIG. 8 and illustrating the relationship between the carrier and a fork.

DESCRIPTION OF THE PREFERRED EMBODIMENTS

Figure 1:
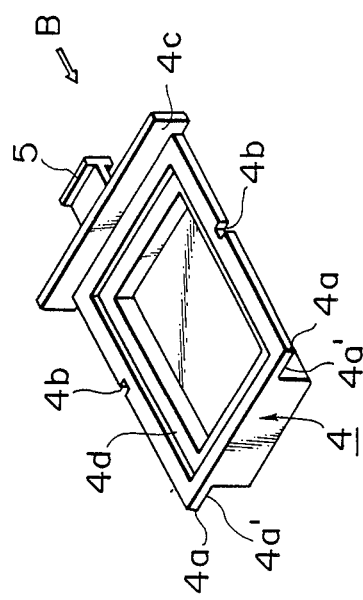
FIG. 1 is a partially broken perspective view showing a lid element of a cassette used in a feeding device according to the present invention.

Referring now the drawings, FIGS. 1-9 illustrate a cassette in a mask feeding apparatus according to one embodiment of the present invention. The cassette comprises a lid element 1 and a box-like tray 4. The lid 1 has a grip 2 formed thereon for facilitating the handling of the lid 1 and pawls 3 which are adapted to engage with respective notches 4b formed in the tray 4 in order to prevent easy detachment of the lid 1 and the tray 4 after they are combined with each other. The lid 1 also includes protruded supports 1a adapted to support the tray 4 when flanges 4a of the tray 4 ride on the supports 1a.

The tray 4 is formed with a stopper 4c relative to the entrance side end of the lid 1 when the lid 1 and the tray 4 are combined with each other. The tray 4 also includes a stepped portion 4d extended from the bottom of the tray for supporting the mask. The lid 1 has a bottom part 1c which assumes the lowermost position when the lid 1 and tray 4 are combined with each other as shown in FIG. 5. A grip 5 is provided on the end of the tray 4 where the stopper 4c is formed, in order to permit easy manual detachment of the tray 4 from the lid 1. A mask 6 can be disposed on the stepped portion 4d of the tray 4 as shown in FIG. 6. For the purpose of prevention of dust deposition, there are provided pellicle film 7 and a pellicle frame 7a as the supporting frame thereof. When the flanges 4a of the tray 4 are supported by the supports 1a of the lid 1, those regions of the flanges 4a as denoted by reference 4a' do not ride on the supports 1a, the ends of these regions being adapted to contact with engaging portions 10 of a fork 11 as will be described hereinafter.

Figure 2:
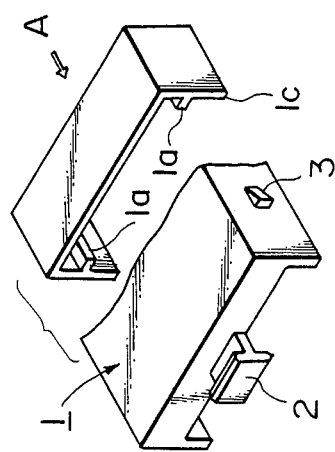
FIG. 2 is a perspective view showing a box element of the cassette.
Figure 4:
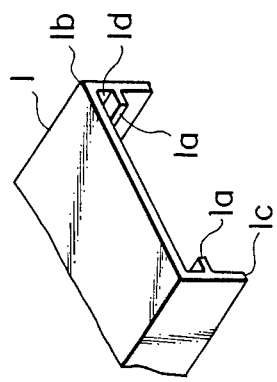
FIG. 4 is a perspective view showing a part of the element shown in FIG. 4, as viewed in the direction of arrow B in FIG. 2.

FIG. 7 is a fragmentary sectional view schematically showing the relationship between one of the pawls 3 shown in FIG. 1 and an associated one of the notches 4b shown in FIG. 2. As shown in this Figure, the pawl 3 has a push end 3a, a rounded engaging portion 3b at the other end and a rotational shaft 3e having its ends rotatably supported by the side wall 1d of the lid 1. A torsion spring 3f engages at one end with the pawl 3 and at the other end with the side wall 1d, so that a counterclockwise rotational force is applied to the pawl 3. When the tray 4 is inserted into the lid 1 as shown in FIGS. 5-7, the engaging end 3b enters into the notch 4b to hold the tray 4. When, on the other hand, the tray 4 as combined with the lid 1 into a cassette is inserted into a carrier 9 (which will be described later), the inner wall 9d of the carrier 9 acts to push the push end 3a toward the tray 4 so that the engaging end 3b disengages from the notch 4b to release it. The counterclockwise biasing force of the torsion spring 3f is still effective to cause the pawl 3 to urge against the inner wall 9d of the carrier 9 so that the lid 1 is frictionally held by the carrier 9.

As shown in FIGS. 8 and 9, the carrier 9 is adapted to store therein a plurality of cassettes each comprising combined lid 1 and tray 4 as shown in FIG. 6. The carrier 9 is provided with protruded stoppers 9b which are located at the opposite ends on one side of the bottom wall and partition walls vertically partitioning inner space of the carrier 9 into plural regions.

FIG. 9 illustrates the manner of automatically taking out only one tray 4 (having therein a desired mask 6) from the carrier 9. A fork 11 movable both in the direction parallel to the surface of the wafer 6 and in the direction orthogonal thereto as shown by double headed arrows by an unshown mechanism is first inserted into the clearance or space 8 defined between the wall of the carrier 9 and the cassette containing therein the desired wafer 6. The width L of each arm of the fork 11 in the direction orthogonal to the longitudinal direction of the fork is made smaller than the width which remains after subtracting the width of the support 1a in the direction orthogonal to the lengthwise direction thereof from the width of the flange 4a in the direction orthogonal to the lengthwise direction thereof. Therefore, when the fork 11 is inserted into the cassette, each arm of width L of the fork can support the region 4a' of the flange 4a which is not in contact with the support 1a.

The carrier 9 also includes stoppers 9a relative to the entrance side end 1b of the lid 1. The stoppers 9a are provided by protrusions formed at the opposite ends on the other side of each of the bottom wall and partition walls of the carrier 9, and are effective to hold the lid 1 within the carrier 9 when the tray 4 is automatically separated from the lid 1 and is taken out from the carrier 9 by the fork 11. The fork 11 has engaging ends 10 which are adapted to engage respectively with recesses (not shown) formed in the end portions 4a' of the tray 4.

Figure 11:
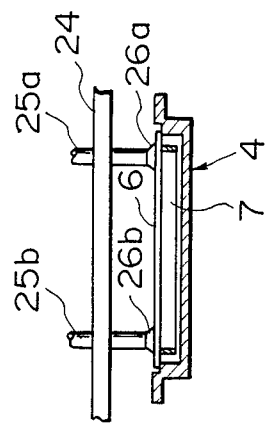
FIG. 11 illustrates the suction mechanism of the feeding apparatus according to the present invention.
Figure 10:
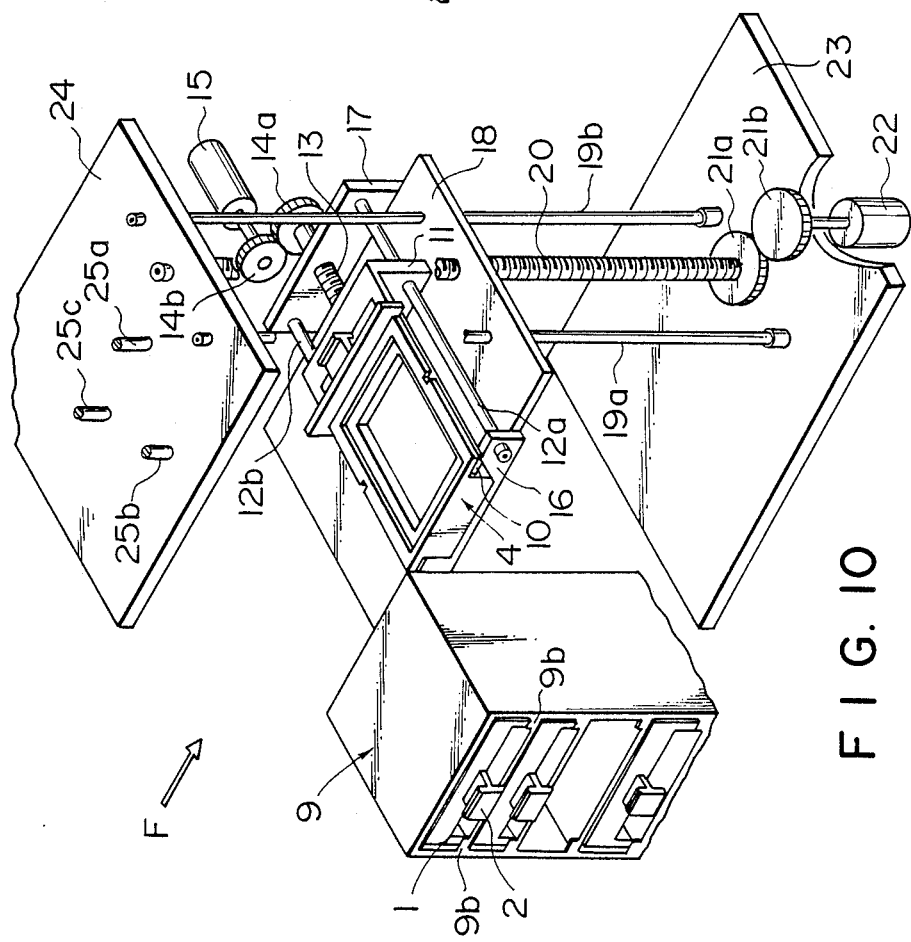
FIG. 10 is a perspective view showing a feeding apparatus according to the present invention.

FIGS. 10 and 11 illustrate the mask feeding apparatus according to one embodiment of the present invention. In FIG. 10, the tray 4 is carried by the fork 11 and is taken out from the carrier 9, the mask contained in the tray 4 being not shown in the drawing. The apparatus includes guide rods 12a and 12b for guiding the fork 11, and a screw 13 which is rotated by a motor 15 through a gear 14b mounted on the shaft of the motor 15 and another gear 14a engaging the gear 14b. The screw 13 is supported by a support member 17 through a bearing, and is threadingly engaged with a threaded pawl formed in the fork 11. Rotation of the screw 13 is effective to move the fork 11 forwardly or backwardly so that it enters into or exits from the carrier 9 through the space 8 shown in FIG. 9 as described in the foregoing. Support members 16 and 17 support the guide rods 12a and 12b. A base plate 18 supports the support members 16 and 17 to permit forward and backward movement of the fork 11. This base plate 18 together with all the elements supported on the base plate, i.e., fork 11, support members 16 and 17, guide rods 12a and 12b, screw 13, motor 15 and gears 14a and 14b are movable in the vertical directions. The apparatus further includes a lower plate 23 located at the lowermost position, an upper plate located at the uppermost position and connecting rods 19a and 19b interconnecting the lower plate 23 with upper plate 24. The rods 19a and 19b extend through the base plate 18 so that they act as guide rods for the base plate 18. A screw 20 is rotated by the rotational force of a motor 22 applied thereto through a gear 21b mounted on the shaft of the motor 22 and a gear 21a secured to the end of the screw 20. Since the screw 20 is threadingly engaged with a threaded hole formed in the base plate 18, one revolution of the screw 20 moves the base plate upwardly or downwardly through the distance corresponding to one pitch of the screw 20. The screw 20 is rotatably supported by the upper plate 24 through a bearing.

FIG. 11 shows the mechanism for taking out the mask from the tray 4. In this Figure, there are shown a mask 6, pellicle film 7, suction cups 26a and 26b and suction cup supporting rods 25a, 25b and 25c which extend through the upper plate 24 and supported by unshown means. These suction cup supporting rods 25a, 25b and 25c are movable in the vertical directions for their position adjustment by an unshown mechanism. Referring back to FIG. 10, the carrier 9 containing therein plural cassettes is disposed so that the tray 4 of each of the cassettes is opposed to the fork 11 as shown in this Figure.

The operation of the mask feeding apparatus will now be described with reference to FIGS. 1-11.

Figure 3:
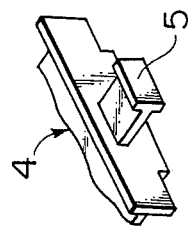
FIG. 3 is a perspective view showing a part of the element shown in FIG. 1, as viewed in the direction of arrow A in FIG. 1.

The mask 6 is first manually disposed on the stepped portion 4d of the tray 4 as shown in FIG. 6, and the tray 4 is inserted into the lid 1 from its entrance side end 1b shown in FIG. 3 while the flanges 4a riding on the supports 1a. At the position whereat the entrance side end 1b of the lid 1 abuts against the stopper 4c of the tray 4, the pawl 3 engages the notch 4b of the tray 4 so that the lid 1 and tray 4 are connected with each other against separation.

The thus combined lid and tray are illustrated in FIGS. 5 and 7, and in FIG. 6 in cross-sectional view.

The cassette as in the FIG. 5 state is manually inserted into the carrier in the direction of arrow D in FIG. 8. The carrier 9 has therein a space 9c for permitting the cassette to override the stoppers 9b. The movement of the cassette into the carrier 9 in the direction of arrow D is limited by stoppers 9a shown in FIG. 9.

The operation for automatically taking out the tray 4 from the carrier 9 will now be described with reference to FIG. 10. In accordance with the rotative positioning of the motor 22, the screw 20 is rotated through the gears 21b and 21a, the base plate 18 and fork 11 are moved while being guided by the guide rods 19a and 19b and are stopped at the position facing the desired cassette. The position can be easily detected by, e.g. an encoder detecting the revolutions of the motor. Although not shown, there is provided a photoswitch for the purpose of safety. Subsequently, the motor 15 rotates to rotate the screw 13 through the gears 14b and 14a so that the fork 11 as in the state shown in FIG. 9 enters through the space 8 into the carrier 9 while being kept out of contact with the tray 4 or the like. The forward movement of the fork 11 is terminated in response to the actuation of a limit switch (not shown) or the like.

After the fork 11 has entered into the carrier 9, the motor 22 rotates through a slight angle to push up the base plate 18 through the gears 21b and 21a, so that the fork 11 moves upwardly through a slight distance to a position whereat the fork 11 engages the flange 4a' of the tray 4 shown in FIG. 2 while the engaging portion 10 of the fork 11 shown in FIG. 9 engages the recess (not shown) formed in the flange 4' of the tray 4. When the motor 15 subsequently rotates to move the fork 11 back to the motor 15 through the gears 14b and 14a, the fork 11 takes out the tray 4 together with the mask 6 from the carrier 9 such as shown in FIG. 10. During this taking-out operation, the lid 1 is blocked by the stoppers 9a of the carrier 9 and also is held by the frictional engagement of the pawl 3 with the inner wall 9d of the carrier 9, so that only the tray 4 is taken out by the fork 11.

The taking-out movement of the fork 11 is terminated at a predetermined position in response to the actuation of a limit switch, not shown. Thereafter, in accordance with the rotation of the motor 22 for vertical movement, the base plate 18 and the fork 11 as well as the tray 4 are moved through the gears 21b and 21a and screw 20 toward the uppermost mask take-up position and are stopped at a predetermined position.

As shown in FIG. 11, the mask is subsequently taken up from the tray 4 in the direction substantially orthogonal to the support surface thereof and is conveyed to the succeeding feeding means. The take-up operation will now be described. The uppermost take-up position is also the position whereat the suction cups 26a and 26b contact the mask 6, so that, at this position, the mask 6 is attracted by suction to the suction cups 26a and 26b. After the mask 6 is attracted, the base plate 18, fork 11, tray 4 and the like move downwardly through a distance in accordance with the rotation of the motor 22 applied thereto through the gears 21b and 21a and screw 20. Thus the mask 6 has been taken out from the tray 4.

Although not shown, the second feeding means approaches in the direction of arrow F to a position whereat it is out of contact with the mask. At this instance, the suction cup supporting rod 25a, 25b and 25c are driven by unshown means to start moving downwardly with the mask 6 and transfer the mask onto the second feeding means. At this position, the suction of the suction cups 26a and 26b is interrupted so that the mask 6 is released. The suction may of course be provided by vacuum. Although not shown, there is provided a positioning mechanism on the upper plate 24 to place the mask at a predetermined position on the second feeding means.

Upon completion of the above operations, the second feeding means feeds the mask to the exposure station. After exposure, the mask is moved back to the carrier 9 in accordance with the operations in the reverse order.

During the storing operation of the mask into the carrier 9, the stoppers 9b shown in FIG. 8 act to hold the lid 1 when the tray 4 is inserted into the lid 1. Although there is a spacing 9c between the lid 1 and carrier 9, the up-and-down movement of the lid 1 is prevented during forward or backward movement of the tray 4 because of the frictional engagement of the pawl 3 with the inner wall 9d of the carrier 9.

Since in the above-described embodiment, the entrance side end 1c of the lid 1 is blocked by the stoppers 9a, and the tray 4 is separated from the lid 1 at the same time that the fork 11 engaging the tray 4 is moved out of the carrier 9. However, this may be modified in the following manner:

That is, the carrier 9 may have a mechanism for pushing the pawl 3 so that the urging force is released at the same time that the cassette is inserted into the carrier 9. In this case, the intimate contact between the stopper 4c and the entrance side end 1b of the lid may be loosened. If so, the stopper 4c may be provided with a recess of such shape that allows the entrance side end 1b to be fitted into the stopper 4c, or the stopper 4c may be provided with a protrusion while the entrance side end 1b may have a recess.

As regards the urging member, the entrance side end 1b and the stopper 4c or there opposing sides may have magnets. Any index mark may be attached to or inserted into the cassette in order to permit that the mask contained in the cassette can be identified from the outside. Alternatively, all of or a part of the cassette may be made of a transparent material for ensuring easy reading of the number of masks contained in the cassette.

The engagement of the fork with the tray may be achieved by providing the fork with an air suction inlet to attract the tray thereto. This may of course be achieved by a magnet.

Although in the above described embodiment, the lid 1 is left in the carrier 9, it is of course possible to provide that the entire cassette including the lid 1 and tray 4 is taken out and the lid 1 is removed at the position of the second feeding means to take up the mask from the tray. Further, an additional feeding means may be provided for receiving the cassette which has been taken out by the fork from the carrier and for feeding the cassette to the uppermost position at which the mask is taken up from the cassette. In this case, the additional feeding means may transfer the mask to the further feeding means for feeding the mask to the exposure station.

In order to prevent imaging of any foreign materials, it has recently been proposed to provide a pellicle frame around the effective surface area of the mask and to cover the mask surface with a pellicle film. The present invention is particularly effective to a mask covered by this pellicle film.

According to the above proposed technique, the pellicle frame and pellicle film are attached to the mask while the space defined by these three elements is sealingly closed in a dust proof state, to thereby prevent deposition of foreign materials from the outside on the mask surface. The foreign materials deposited on the pellicle film surface are spaced apart from the mask surface by a distance corresponding to the thickness of the pellicle frame, so that no image of the foreign material is formed on the wafer.

However, the pellicle film is very thin and weak and is very expensive. Therefore, in view of its damage or soiling, it is not desirable to move the feeding means along a path close to the pellicle film. If the device is arranged so that the mask is taken up from the tray in the direction parallel to the mask supporting surface of the tray, there is a possibility that the fork contact with the pellicle frame or pellicle film. Since the pellicle film is very weak, it may be broken by the impact of the contact.

In accordance with the present invention, on the other hand, the mask is taken up from the tray in the direction orthogonal to the mask supporting surface of the tray rather than by a transversely moving the fork or the like, so that any possibility of damage or spoiling of the pellicle film is eliminated.

According to the present invention as has been described in detail, the mask is contained in a cassette which facilitates the handling or interchanging the masks. Further, the mask is moved from the carrier to the second feeding position while it is contained in the tray with the pattern film surface of the mask facing downwardly, so that the pattern film surface is sheltered, whereby deposition of dusts floating in the air onto the pattern film surface is prevented.

While the invention has been described with reference to the structures disclosed herein, it is not confined to the details set forth and this application is intended to cover such modifications or changes as may come within the purposes of the improvements or the scope of the following claims.

What is claimed is:

1. A device for conveying a sheet member having a pattern for an integrated circuit, comprising:
    a plurality of first members each for covering at least a top of one of a plurality of sheet members;
    a plurality of second members each for covering at least a bottom of one of the plurality of sheet members and each having a surface for supporting one of the plurality of sheet members at its bottom, wherein each of said second members is associated with one of said first members, wherein each of said second members is engageable with its associated first member, and wherein each of said second members is disengageable from its associated first member by movement thereof in a direction substantially parallel to said supporting surface for the sheet member;
    means for accommodating combinations of said first members and their associated second members in an array extending substantially perpendicular to said supporting surfaces; and
    conveying means for moving one of said second members together with the sheet member supported thereon in a direction substantially parallel to said supporting surface to disengage said one of said second members, together with the sheet member supported thereon, from its associated first member and for conveying said one of said second members together with the sheet member supported thereon out of said accommodating means.

2. A device according to claim 1, wherein each said second member has an engaging portion for engaging each said second member with an associated first member and for disengaging each said second member from said associated first member, each said engaging portion including a portion at which said associated first member and said associated second member are slidable relative to each other.

3. A device according to claim 1, wherein said sheet member includes a pellicle.

4. A device according to claim 1, wherein said conveying means includes a fork.

5. A device according to claim 1, further comprising a second conveying means for separating the sheet member from said second member and conveying the sheet member.

6. A method of conveying a sheet member having a pattern for an integrated circuit, comprising the steps of:
    covering at least the tops of a plurality of sheet members each with a respective one of a plurality of first members;
    covering at least the bottoms of the plurality of sheet members each with a respective one a plurality of second members, wherein each of said first members is associated with one second member;
    supporting each of the plurality of sheet members on a supporting surface of a different one of said plurality of second members;
    accommodating in accommodating means combinations of said first members and their associated second members in an array extending substantially perpendicular to said supporting surface;
    moving one of said plurality of said second members together with the sheet member supported thereon in a direction substantially parallel to said supporting surface to disengage said one of said plurality of second members together with the sheet member supported thereon from its associated first member and conveying said one of said second members together with the sheet member supported thereon out of said accommodating means.

7. A method according to claim 6, wherein the moving step includes a sliding action between said first member and said second member.

8. A method according to claim 6, wherein the sheet member includes a pellicle.

9. A method according to claim 6, wherein said one of said first and second members is restored to a place where it is located in said accommodating step.

* * * * *

UNITED STATES PATENT AND TRADEMARK OFFICE
CERTIFICATE OF CORRECTION

PATENT NO. : 4,758,127  Page 1 of 2
DATED : July 19, 1988
INVENTOR(S) : SHUNZO IMAI, ET AL.

It is certified that error appears in the above-identified patent and that said Letters Patent is hereby corrected as shown below:

On the Title Page,
AT [56] IN THE REFERENCES CITED

Other Publications, "Fitzpatrick, Cella Harper & Scinto" should read --Fitzpatrick, Cella, Harper & Scinto--.

COLUMN 1

Line 48, "stop-and-repeat" should read --step-and-repeat--.

COLUMN 3

Line 40, "combined" should read --a combined--.
    Line 49, "double" should read --double- --.

COLUMN 4

Line 30, "upper plate" should read --upper plate 24--.
    Line 48, "supported" should read --are supported--.

COLUMN 6

Line 23, "and" should be deleted.
    Line 38, "there" should read --their--.
    Line 67, "to" should read --for--.

COLUMN 7

Line 17, "contact" should read --may contact--.
    Line 25, "a" should be deleted.

UNITED STATES PATENT AND TRADEMARK OFFICE
CERTIFICATE OF CORRECTION

PATENT NO. : 4,758,127
DATED : July 19, 1988
INVENTOR(S) : SHUNZO IMAI, ET AL.

It is certified that error appears in the above-identified patent and that said Letters Patent is hereby corrected as shown below:

COLUMN 8

Line 35, "one a" should read --one of a--.

Signed and Sealed this

Second Day of May, 1989

*Attest:*

DONALD J. QUIGG

*Attesting Officer*     *Commissioner of Patents and Trademarks*